United States Patent
Kim et al.

(10) Patent No.: US 9,915,865 B2
(45) Date of Patent: Mar. 13, 2018

(54) PHOTOMASK INCLUDING MONITORING MARKS

(71) Applicant: Samsung Display Co., Ltd., Yongin-si, Gyeonggi-do (KR)

(72) Inventors: Su In Kim, Asan-si (KR); Yong Hoon Kim, Anyang-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 60 days.

(21) Appl. No.: 15/074,106

(22) Filed: Mar. 18, 2016

(65) Prior Publication Data
US 2017/0017149 A1  Jan. 19, 2017

(30) Foreign Application Priority Data

Jul. 17, 2015 (KR) .................. 10-2015-0101694

(51) Int. Cl.
*G03F 1/44* (2012.01)
(52) U.S. Cl.
CPC ..................... *G03F 1/44* (2013.01)
(58) Field of Classification Search
CPC ........................................ G03F 1/44
USPC ............................................................ 430/5
See application file for complete search history.

(56) References Cited

U.S. PATENT DOCUMENTS 5,674,650 A * 10/1997 Dirksen .............. G03F 7/70558
355/62
2016/0033880 A1 * 2/2016 Kim .......................... G03F 1/44
257/499

FOREIGN PATENT DOCUMENTS

| KR | 10-2001-0060171 A | 7/2001 |
| KR | 10-2003-0058582 A | 7/2003 |
| KR | 10-2004-0060190 A | 7/2004 |
| KR | 10-2008-0047778 A | 5/2008 |
| KR | 10-2010-0010696 A | 2/2010 |

* cited by examiner

*Primary Examiner* — John A McPherson
(74) *Attorney, Agent, or Firm* — Knobbe Martens Olson & Bear LLP

(57) ABSTRACT

A photomask including monitoring marks is disclosed. In one aspect, the photomask includes a transparent substrate, a mask pattern formed on an upper surface of the transparent substrate, and a monitoring mark having a line width pattern shared with the mask pattern. The monitoring mark is configured to receive a laser beam so as to measure a power state of the laser beam.

16 Claims, 10 Drawing Sheets second direction
first direction

PHOTOMASK INCLUDING MONITORING MARKS

RELATED APPLICATIONS

This application claims priority to and the benefit of Korean Patent Application No. 10-2015-0101694 filed in the Korean Intellectual Property Office on Jul. 17, 2015, the entire contents of which are incorporated herein by reference.

BACKGROUND

Field

The described technology generally relates to a photomask including monitoring marks.

Description of the Related Technology

Example types of flat panel displays include liquid crystal displays (LCDs), plasma display devices (PDPs), organic light-emitting diode (OLED) displays, electric field effect displays (FEDs), and electrophoretic displays (EPDs).

These displays are manufactured through a semiconductor process, and various patterns are formed in the process. An exposure apparatus exposes a target substrate to form these patterns using non-visible light and a photomask.

To realize the desired high resolution required by modern photolithography, light having a short wavelength must be used, and an ArF excimer laser having a 193 nm wavelength is frequently used. The laser emits multiple beams onto a photomask by sequential scanning, and in this case, it is important for the energy emitted by each beam to be the same. Particularly, the energy magnitude of opposing beams determines a line width (critical dimension; CD) of the photomask pattern.

Currently, when manufacturing the photomask, the exposure apparatus can monitor the beam power. The monitoring mechanism is confirmed through the manufacturing of the test mark. However, it is difficult to confirm the amount of the beam power passing through a photomask that is actually manufactured. Also, when checking for problems, it is difficult to confirm whether the problems also occur at a particular location in the mask. Thus, it is difficult to confirm in real time the line width state and the beam power state of the photomask when it is in use.

The above information disclosed in this Background section is only for enhancement of understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to a photomask that can confirm a power state of the laser beam in real time by including the monitoring marks in the photomask in the exposure apparatus.

Another aspect is a photomask that includes: a transparent substrate; a mask pattern formed in an upper surface of the transparent substrate; and a monitoring mark having a line width pattern that is common with the mask pattern and for measuring a power state of a laser beam.

The monitoring mark can include a plurality of first light blocking pattern lines placed across spaces that are repeatedly disposed in parallel in a first direction.

The monitoring mark can be formed such that a width of the space and a width of the first light blocking pattern line are the same.

The laser beam can be formed such that eleven unit laser beams are sequentially emitted toward the mask pattern and the monitoring mark, and the space can be formed to have the width passing twelve unit laser beams.

The space can be formed to pass the unit laser beam having the same energy in both edges.

The monitoring mark can further include a plurality of second light blocking pattern lines placed across the spaces that are repeatedly disposed in a second direction perpendicular to the first direction and disposed in the second direction.

The monitoring mark can be formed such that the width of the space and the width of the second light blocking pattern line are the same.

The monitoring mark can be positioned outside the mask pattern.

The monitoring mark can be positioned in a right upper region or a left lower region of the mask pattern.

The monitoring mark can be provided one by one in the right region or the left region of the mask pattern.

The monitoring mark can include at least one unit monitoring mark, and the unit monitoring mark can be formed to measure the width of the spaces repeatedly disposed in the first direction or the spaces repeatedly disposed in the second direction perpendicular to the first direction.

The unit monitoring mark can include a plurality of first light blocking pattern lines disposed in parallel in the first direction in three regions, and a plurality of second light blocking pattern lines disposed in parallel in the second direction perpendicular to the first direction in one region.

The unit monitoring mark can be formed with a square shape.

The monitoring mark can include four unit monitoring marks.

The monitoring mark can include sixteen unit monitoring marks.

Another aspect is a photomask for manufacturing a display device, comprising: a transparent substrate; a mask pattern formed on an upper surface of the transparent substrate; and a monitoring mark having a line width pattern shared with the mask pattern, wherein the monitoring mark is configured to receive a laser beam so as to measure a power state of the laser beam.

In the above photomask, the monitoring mark includes a plurality of first light blocking pattern lines disposed in parallel with a gap formed therebetween and extending in a first direction.

In the above photomask, the gap has a width that is the same as the width of each of the first light blocking pattern lines.

In the above photomask, the laser beam comprises sequentially emitted eleven unit laser beams, wherein the gap is sized to pass through the twelve unit laser beams that include the eleven unit laser beams and one of the eleven unit laser beams repeated once.

In the above photomask, the twelve unit laser beams include a pair of unit laser beams having the same energy and configured to pass through opposing edges of the gap.

In the above photomask, the monitoring mark further includes a plurality of second light blocking pattern lines disposed in a second direction crossing the first direction.

In the above photomask, the gap has a width that is the same as the width of each of the second light blocking pattern lines.

In the above photomask, the monitoring mark and the mask pattern do not overlap in the depth dimension of the photomask.

In the above photomask, the monitoring mark is positioned in an upper right region or a lower left region of the mask pattern.

In the above photomask, the monitoring mark comprises a plurality of monitoring marks provided in the right region or the left region of the mask pattern.

In the above photomask, the monitoring mark includes at least one unit monitoring mark so as to measure the width of a plurality of first gaps repeatedly disposed in a first direction or a plurality of second gaps repeatedly disposed in a second direction crossing the first direction.

In the above photomask, the unit monitoring mark includes: a plurality of first light blocking pattern lines disposed in parallel and extending in the first direction in three regions; and a plurality of second light blocking pattern lines disposed in parallel and extending in the second direction in one region.

In the above photomask, the unit monitoring mark has a square shape.

In the above photomask, the unit monitoring mark includes four unit monitoring marks.

In the above photomask, the unit monitoring mark includes sixteen unit monitoring marks.

Another aspect is a photomask for manufacturing a display device, comprising: a transparent substrate; a mask pattern formed on the transparent substrate; and a plurality of monitoring marks formed on the transparent substrate, wherein the monitoring marks include a plurality of first light blocking pattern lines disposed in parallel and a plurality of gaps formed between the first light blocking pattern lines, and wherein the gaps are configured for passage of a laser beam.

In the above photomask, the monitoring marks include first, second and third monitoring marks each i) including the first light blocking pattern lines extending in a first direction and ii) respectively including a plurality of first, second and third gaps formed between the respective first light blocking patterns, wherein the first gaps have the same width, wherein the second gaps have the same width, and wherein the third gaps have the same width.

In the above photomask, the widths of the first, second and third gaps are different from one another.

In the above photomask, the monitoring marks further includes a fourth monitoring mark including a plurality of second light block pattern lines extending in a second direction crossing the first direction, wherein the fourth monitoring mark includes a plurality of fourth gaps formed between the second light block pattern lines, and wherein the fourth gaps have the same width.

In the above photomask, the first, second, third and fourth monitoring marks are formed side by side.

According to at least one of the disclosed embodiments, by including the monitoring mark measuring the pattern line width in the X direction and the Y direction in the photomask used in the exposure apparatus, the power state of the laser beam can be checked in real time. When a problem is detected in the power of the laser beam, the power state is immediately adjusted, thereby preventing secondary damage to the following photomask.

Also, the test mark manufacturing and the separate exposure apparatus for the laser beam power monitoring separately from the photomask can prevent production from being stopped.

DETAILED DESCRIPTION OF CERTAIN INVENTIVE EMBODIMENTS

Figure 1:
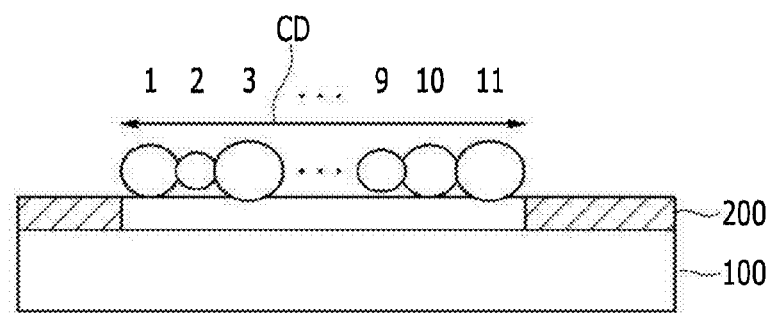
FIG. 1 is a cross-sectional view of a photomask according to an exemplary embodiment showing a shape in which a laser beam having energy forms a pattern through a mask pattern.

The described technology will be described more fully hereinafter with reference to the accompanying drawings, in which exemplary embodiments are shown. As those skilled in the art would realize, the described embodiments can be modified in various different ways, all without departing from the spirit or scope of the described technology.

Further, in exemplary embodiments, since like reference numerals designate like elements having the same configuration, a first exemplary embodiment is representatively described, and in other exemplary embodiments, only different configurations from the first exemplary embodiment will be described.

The drawings are schematic and are not illustrated in accordance with a scale. The relative sizes and ratios of the parts in the drawings are exaggerated or reduced for clarity and convenience in the drawings, and the arbitrary sizes are only exemplary and are not limiting. The same structures, elements, or parts illustrated in no less than two drawings are denoted by the same reference numerals in order to represent similar characteristics.

Exemplary embodiments specifically show one exemplary embodiment. As a result, various modifications of the drawings are anticipated. Accordingly, the exemplary embodiments are not limited to certain forms of the regions illustrated, but can include forms that are modified through manufacturing, for example. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Hereinafter, a monitoring mark and a photomask including the same according to an exemplary embodiment will be described with reference to FIG. 1 to FIG. 3D.

Figure 2:
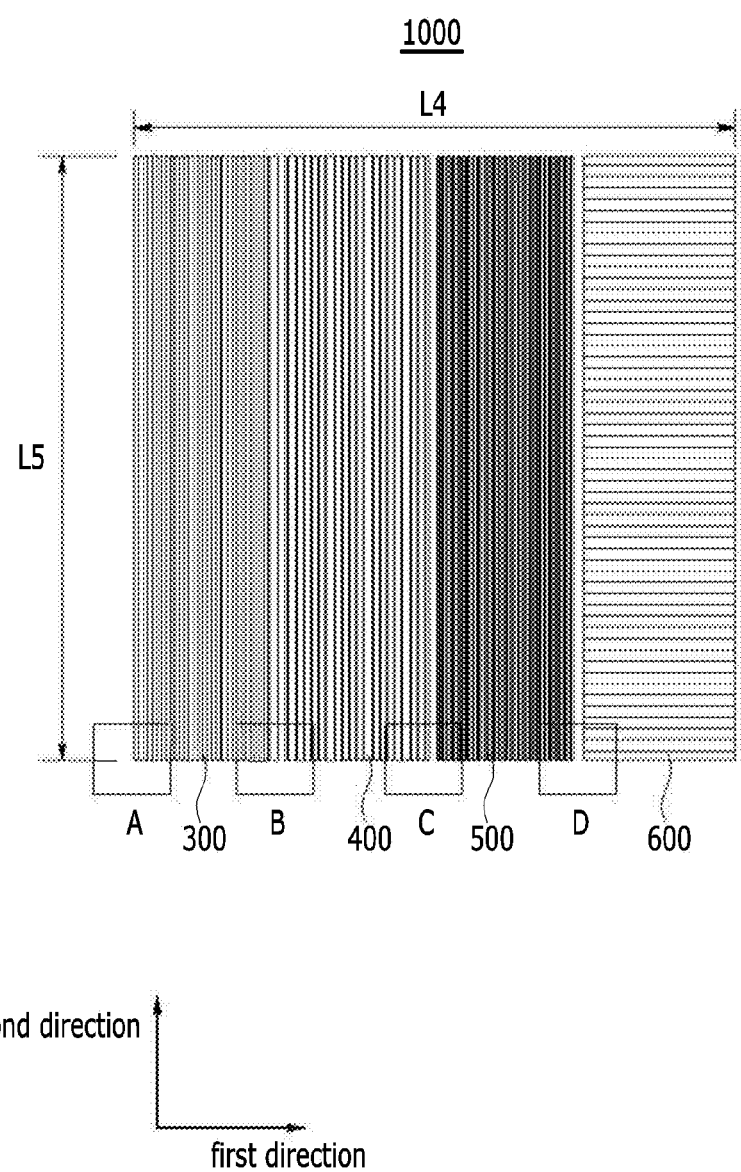
FIG. 2 is a top plan view schematically showing a monitoring mark according to an exemplary embodiment.

FIG. 1 is a cross-sectional view of a photomask according to an exemplary embodiment showing a shape in which a laser beam having energy forms a pattern through a mask pattern. FIG. 2 is a top plan view schematically showing a monitoring mark according to an exemplary embodiment. FIG. 3A to FIG. 3D are views showing various patterns of the monitoring mark shown in FIG. 2 of the described technology.

Referring to FIG. 1, a photomask includes a transparent substrate 100 and a mask pattern 200 formed on an upper surface of the transparent substrate 100. The mask pattern 200 realizes a predetermined circuit pattern to manufacture a semiconductor element. The mask pattern 200 can be formed of a photoresist film and is a region through which a laser beam does not pass. The photoresist film is formed on the entire surface of the transparent substrate 100, the photoresist film is selectively exposed by using an exposure apparatus, and then the exposed photoresist film is developed to expose the region where the circuit pattern is formed.

The laser beam passes through a space (or gap) where the mask pattern 200 is not formed, and the laser beam determines a line width (a critical dimension; CD) of the mask pattern 200. As shown in FIG. 1, the laser beam is formed to sequentially emit eleven unit laser beams toward the mask pattern, and the energy of the first unit laser beam and the energy of the eleventh unit laser beam play an important role in determining the line width CD of the mask pattern 200. The overlapping circles represent energy magnitude of the respective unit laser beams, and a line width (CD) of the mask pattern is measured by sequentially emitting the first unit laser beam to the eleventh unit laser beam.

As shown in FIG. 2, a monitoring mark 1000 has a line width (CD) pattern that is in common with the mask pattern 200 of FIG. 1, and the power state of the laser beam is monitored by emitting the laser beam to the line width (CD) pattern. The monitoring mark 1000 includes a first monitoring mark 300, a second monitoring mark 400, a third monitoring mark 500, and a fourth monitoring mark 600. The first monitoring mark 300 to the third monitoring mark 500 include a plurality of first light blocking pattern lines disposed in parallel in a first direction. Power status of the unit laser beam passing through the line width pattern may be monitored.

Also, the fourth monitoring mark 600 includes a plurality of second light blocking pattern lines repeatedly disposed in a second direction substantially perpendicular to (or crossing) the first direction.

As shown in FIG. 2, the monitoring mark 1000 is used to measure the width of the spaces that are repeatedly disposed in the first direction in the first to third monitoring marks 300, 400 and 500 and the width of the spaces that are repeatedly disposed in the second direction in the fourth monitoring mark 600.

That is, the monitoring mark 1000 can include a plurality of first light blocking pattern lines disposed in parallel in the first direction in three regions, and can include a plurality of second light blocking pattern lines disposed in parallel in the second direction substantially perpendicular to (or crossing) the first direction in one region.

Also, the monitoring mark 1000 can be formed of a square shape of a transverse length L4 of about 1000 μm and a longitudinal length L5 of about 1000 μm.

Figure 3A:
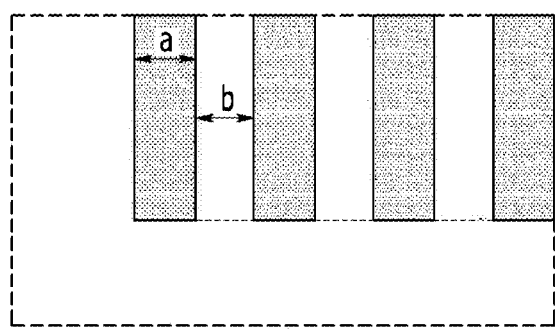
FIGS. 3A, 3B, 3C and 3D are views showing various patterns of the monitoring mark shown in FIG. 2.

FIG. 3A to FIG. 3D are the views showing the various patterns of the monitoring mark shown in FIG. 2. Referring to FIG. 3A, which is the view A of FIG. 2 showing the pattern of the first monitoring mark 300, this is a pattern used to measure the laser beam when using the photomask in the apparatus using nine laser beams for the exposure.

The first monitoring mark 300 can include nine first light blocking pattern lines disposed in parallel and extending in the first direction. The width of the space and the width of the first light blocking pattern line can be substantially the same. For example, the width a of the light blocking pattern line and the width b of the space are about 2.5 μm.

On the other hand, the laser beam can be formed to sequentially emit the eleven unit laser beams toward the monitoring mark, and the spaces can have the width corresponding to twelve unit laser beams passing therethrough. Since the first unit laser beam is again emitted after the first to eleventh unit laser beams are sequentially emitted, by forming the space to have the width large enough to have twelve unit laser beam passing through, the first unit of the laser beam having the same energy can be configured to pass through both edges of the space. The width of the spaces should have at least same width with that of the laser beam having maximum width.

When the first unit laser beam passes through both edges of the first space, the line width of the first space can be measured, and while the unit laser beam passes through both edges of the second space, the line width of the second space can be measured. When the fifth, seventh, ninth, and eleventh unit laser beams pass through both edges of the space, the line width of the space is measured. And while the second, fourth, sixth, eighth, and tenth unit laser beams are passed, the line width of the space is measured. In this way, the line width of the space is measured while the sixth unit laser beam passes through both edges of the ninth space.

In the process of measuring the line width of the laser beams, when the laser beam from the initial predetermined line width to the monitoring mark 1000 is different, which means that the light energy of the unit laser beam has changed, the laser beam apparatus can be immediately replaced or adjusted to be applied to the following photomask.

Figure 3B:
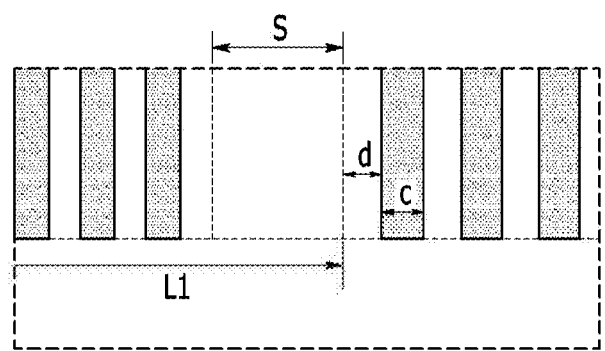

Referring to FIG. 3B, which is the view B of FIG. 2 showing the pattern of the second monitoring mark 400, the pattern of FIG. 3B is a pattern part to measure the laser beam when using the photomask 1000 in the apparatus exposing eleven laser beams which is different from the pattern of FIG. 3A.

The second monitoring mark 400 can include eleven first light blocking pattern lines disposed in parallel in the first direction. The width d of the space and the width c of the first light blocking pattern line can be substantially the same. For example, the width c of the light blocking pattern line and the width d of the space are about 3 μm. Also, an interval S of about 10 μm can be formed between the patterns of the first monitoring mark 300 and the second monitoring mark 400. Also, a total length L1 of the first monitoring mark 300 in the first direction can be about 240 μm.

The method of monitoring the light energy of the laser beam by the second monitoring mark 400 is the same as the monitoring method for the first monitoring mark 300 such that the description thereof is omitted.

Figure 3C:
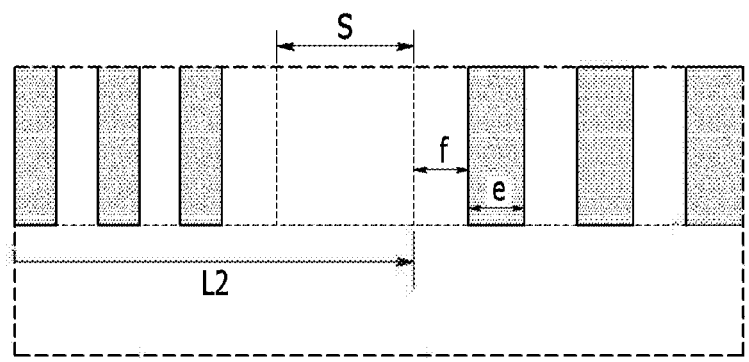

Referring to FIG. 3C, which is the view C of FIG. 2 showing the pattern of the third monitoring mark 500, this is the pattern part to measure the laser beam in the exposure apparatus of eleven laser beams.

The third monitoring mark 500 can include the eleven first light blocking patterns lines disposed in parallel in the first direction. The width f of the space and the width e of the first light blocking pattern line can be substantially the same. For example, the width f of the space and the width e of the first light blocking pattern line are about 4.32 μm. Also, the interval S of about 10 μm can be formed between the patterns of the second monitoring mark 400 and the third monitoring mark 500. Also, the total length L2 of the second monitoring mark 400 in the first direction can be about 244 μm.

Figure 3D:
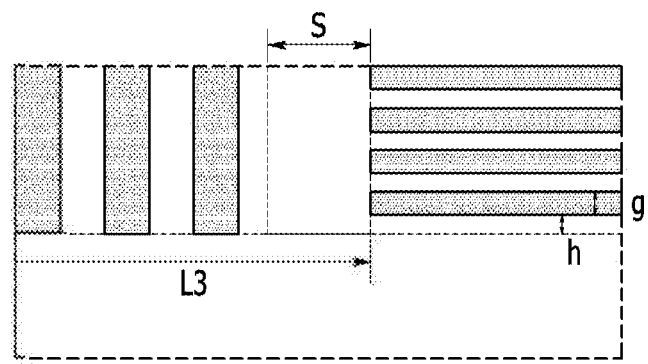

Referring to FIG. 3D, which is the view D of FIG. 2 showing the pattern of the fourth monitoring mark 600, the fourth monitoring mark 600 includes a plurality of second light blocking pattern lines that are repeatedly disposed in the second direction. The width h of the space and the width g of the second light blocking pattern line can be substantially the same. For example, the width h of the space and the width g of the second light blocking pattern line are about 2.0 μm. Also, the interval S of about 10 μm can be formed between the patterns of the third monitoring mark 500 and the fourth monitoring mark 600. Also, the total length L3 of the third monitoring mark 500 in the first direction can be about 236 μm.

The laser beam can be monitored with reference to the line width in the first direction when using the photomask in the different exposure apparatuses through the first to third monitoring marks 300, 400, and 500 by the patterns of FIG. 3A, FIG. 3B, and FIG. 3C. Also, the laser beam can be monitored with reference to the line width in the second direction in all exposure apparatuses through the fourth monitoring mark 600 by the pattern of FIG. 3D.

Figure 4:
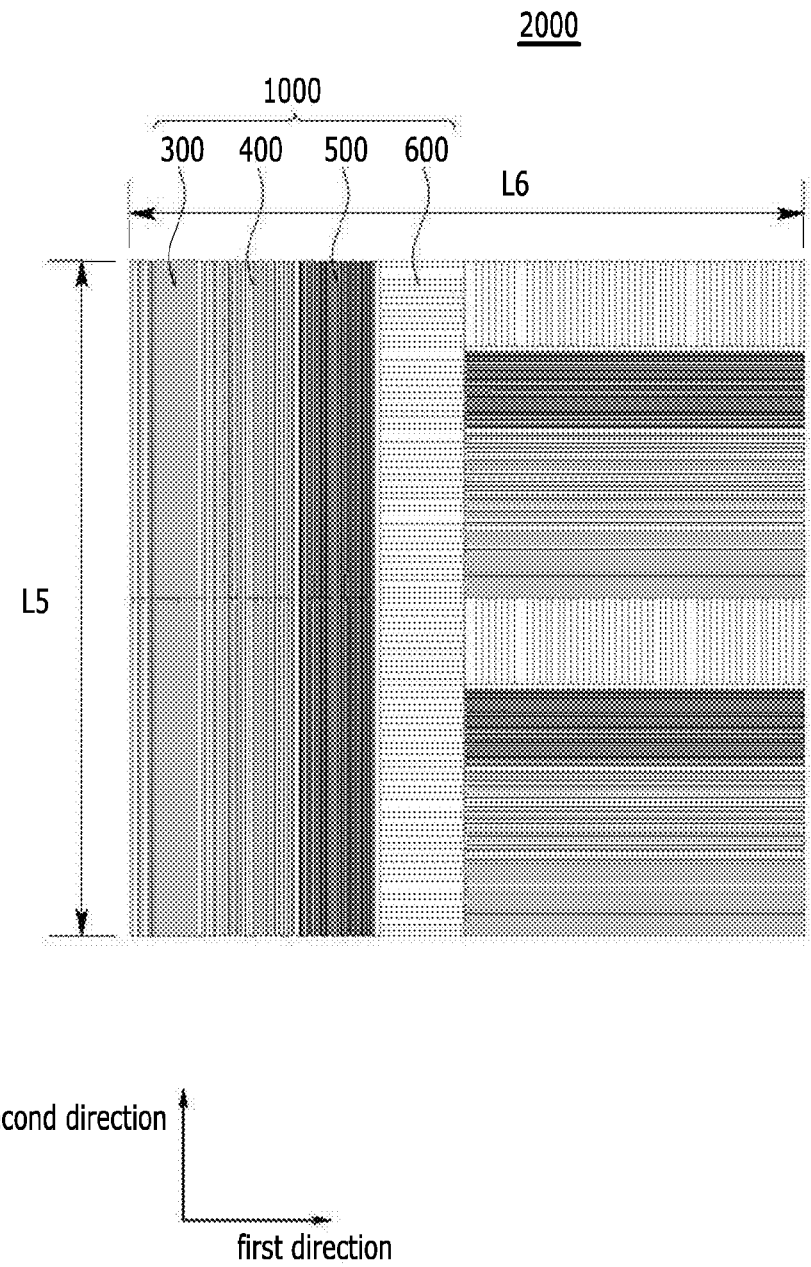
FIG. 4 is a top plan view schematically showing a monitoring mark according to another exemplary embodiment.

FIG. 4 is a top plan view schematically showing a monitoring mark 2000 according to another exemplary embodiment. Referring to FIG. 4, the monitoring mark 2000 includes four unit monitoring marks 1000. Each unit monitoring mark 1000 can be the same as the monitoring mark 1000 shown in FIG. 2, and in the present exemplary embodiment, the monitoring mark 2000 can be formed as a square with a transverse length L6 of about 2000 μm and a longitudinal length L5 of about 2000 μm.

As shown in FIG. 4, in the present exemplary embodiment, the monitoring mark 2000 has a shape such that the monitoring marks 1000 shown in FIG. 2 are disposed two on the left and two on the right, which are rotated by 90 degrees.

Figure 5:
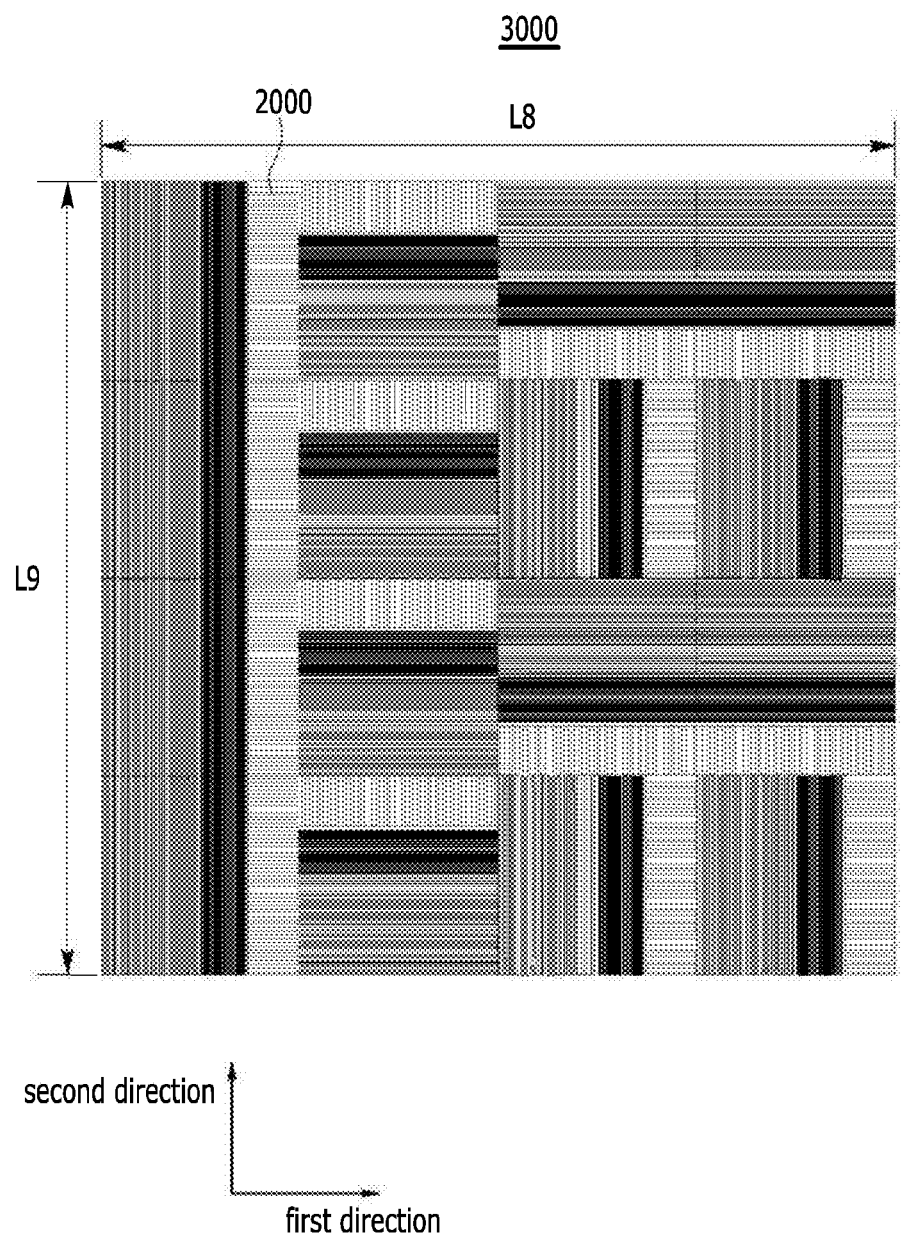
FIG. 5 is a top plan view schematically showing a monitoring mark according to another exemplary embodiment.

FIG. 5 is a top plan view schematically showing a monitoring mark 3000 according to another exemplary embodiment. Referring to FIG. 5, the monitoring mark 3000 includes sixteen unit monitoring marks 1000. Each unit monitoring mark 1000 can be formed the same as monitoring mark 1000 shown in FIG. 2. For example, the monitoring mark 3000 has a shape such that four monitoring marks 2000 shown in FIG. 4 are disposed. In the present exemplary embodiment, the monitoring mark 3000 is formed of the square shape with a transverse length L8 of about 4000 μm and a longitudinal length L9 of about 4000 μm.

As shown in FIG. 5, the monitoring mark 3000 can have a shape such that the monitoring marks 2000 are disposed two on the left and two on the right, which are rotated by 90 degrees.

Figure 6:
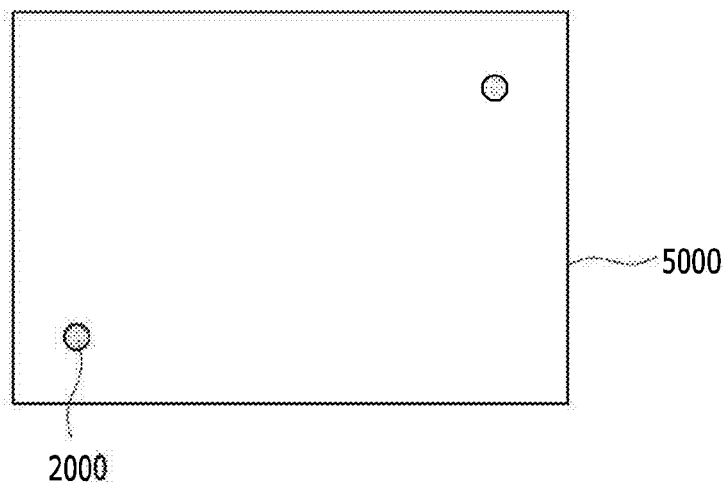
FIG. 6 is a view showing a position of a monitoring mark of a photomask according to an exemplary embodiment.

FIG. 6 is a view showing a position of a monitoring mark of a photomask according to an exemplary embodiment. The photomask 5000 can be formed with a transverse length of about 920 mm and a longitudinal length of about 800 mm, and the monitoring mark 2000 can be positioned outside the mask pattern 200 shown in FIG. 1. As shown in FIG. 6, the monitoring marks 2000 are positioned in the right upper region and the left lower region of the mask pattern 200. Also, the monitoring mark 2000 can be positioned in the right upper region or the left lower region of the mask pattern 200. In this case, the monitoring mark can be the unit monitoring mark 1000 shown in FIG. 2, the monitoring mark 2000 shown in FIG. 4, or the monitoring mark 3000 shown in FIG. 5.

Figure 7:
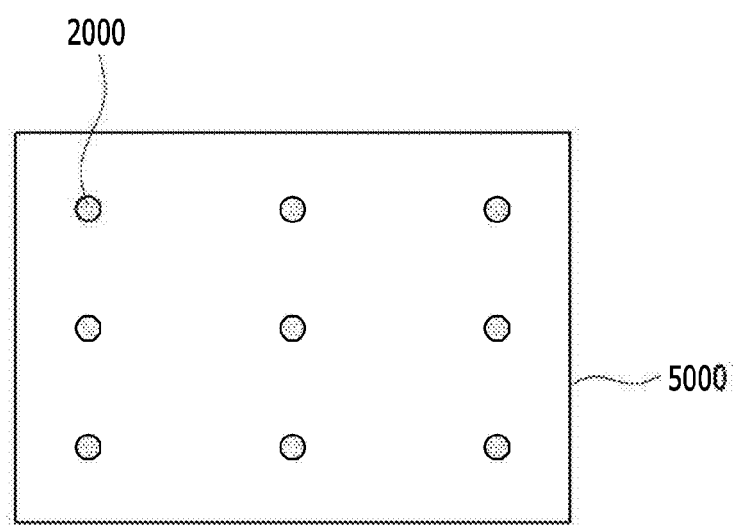
FIG. 7 is a view showing a position of a monitoring mark of a photomask according to another exemplary embodiment.

FIG. 7 is a view showing a position of a monitoring mark of a photomask according to another exemplary embodiment. As shown in FIG. 7, nine monitoring marks 2000 are provided throughout the entire region of the photomask 5000 outside the mask pattern 200 shown in FIG. 1. The monitoring mark can be the unit monitoring mark 1000 shown in FIG. 2, the unit monitoring mark 2000 shown in FIG. 4, or the monitoring mark 3000 shown in FIG. 5.

According to at least one of the disclosed embodiments, by including the monitoring mark measuring the pattern line widths in the X direction and the Y direction in the photomask used in the exposure apparatus, the power state of the laser beam can be checked in real time. When a problem is generated in the power of the laser beam, the power state is immediately adjusted, thereby preventing secondary damage to the following photomask.

Also, the test mark manufacturing and the exposure apparatus for the laser beam power monitoring separately from the photomask can be prevented from being stopped.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photomask for manufacturing a display device, comprising:
    a transparent substrate;
    a mask pattern formed on an upper surface of the transparent substrate; and
    a monitoring mark having a line width pattern shared with the mask pattern, wherein the monitoring mark is configured to receive a laser beam so as to measure a power state of the laser beam,
    wherein the monitoring mark includes a plurality of first light blocking pattern lines disposed in parallel with a gap formed therebetween and extending in a first direction,
    wherein the laser beam comprises sequentially emitted N unit laser beams,
    wherein the gap is sized to pass through N+1 unit laser beams that include the N unit laser beams and one of the N unit laser beams repeated once, and
    wherein N is a natural number.

2. The photomask of claim 1, wherein the gap has a width that is the same as the width of each of the first light blocking pattern lines.

3. The photomask of claim 1, wherein the N+1 unit laser beams include a pair of unit laser beams having the same energy and configured to pass through opposing edges of the gap.

4. The photomask of claim 1, wherein the monitoring mark further includes a plurality of second light blocking pattern lines disposed in a second direction crossing the first direction.

5. The photomask of claim 4, wherein the gap has a width that is the same as the width of each of the second light blocking pattern lines.

6. The photomask of claim 1, wherein the monitoring mark and the mask pattern do not overlap in the depth dimension of the photomask.

7. The photomask of claim 1, wherein the monitoring mark is positioned in an upper right region or a lower left region of the mask pattern.

8. The photomask of claim 7, wherein the monitoring mark comprises a plurality of monitoring marks provided in the right region or the left region of the mask pattern.

9. The photomask of claim 1, wherein the monitoring mark includes at least one unit monitoring mark so as to measure the width of a plurality of first gaps repeatedly disposed in a first direction or a plurality of second gaps repeatedly disposed in a second direction crossing the first direction.

10. The photomask of claim 9, wherein the unit monitoring mark includes:
    a plurality of first light blocking pattern lines disposed in parallel and extending in the first direction in three regions; and
    a plurality of second light blocking pattern lines disposed in parallel and extending in the second direction in one region.

11. The photomask of claim 10, wherein the unit monitoring mark has a square shape.

12. The photomask of claim 10, wherein the unit monitoring mark includes four unit monitoring marks.

13. The photomask of claim 10, wherein the unit monitoring mark includes sixteen unit monitoring marks.

14. A photomask for manufacturing a display device, comprising:
    a transparent substrate;
    a mask pattern formed on the transparent substrate; and
    a plurality of monitoring marks formed on the transparent substrate, wherein the monitoring marks include a plurality of first light blocking pattern lines disposed in parallel and a plurality of gaps formed between the first light blocking pattern lines, and wherein the gaps are configured for passage of a laser beam,
    wherein the monitoring marks include first, second and third monitoring marks each i) including the first light blocking pattern lines extending in a first direction and ii) respectively including a plurality of first, second and third gaps formed between the respective first light blocking patterns, wherein the first gaps have the same width, wherein the second gaps have the same width, wherein the third gaps have the same width, and wherein the widths of the first, second and third gaps are different from one another.

15. The photomask of claim 14, wherein the monitoring marks further includes a fourth monitoring mark including a plurality of second light block pattern lines extending in a second direction crossing the first direction, wherein the fourth monitoring mark includes a plurality of fourth gaps formed between the second light block pattern lines, and wherein the fourth gaps have the same width.

16. The photomask of claim 15, wherein the first, second, third and fourth monitoring marks are formed side by side.

* * * * *